United States Patent [19]

Yamada et al.

[11] Patent Number: 5,018,000
[45] Date of Patent: May 21, 1991

[54] SEMICONDUCTOR DEVICE USING MIS CAPACITOR

[75] Inventors: Toshio Yamada, Nishitama; Tohru Kobayashi, Iruma; Hirotaka Nishizawa, Akishima; Hiroyuki Itoh, Kodaira; Tatsuya Saitoh, Kokubunji, all of Japan

[73] Assignee: Hitachi, Ltd., Tokyo, Japan

[21] Appl. No.: 367,046

[22] Filed: Jun. 16, 1989

[30] Foreign Application Priority Data

Jun. 24, 1988 [JP] Japan ................. 63-154693

[51] Int. Cl.⁵ ............... H01L 27/02; H01L 29/92; H01L 29/68; H01L 29/78
[52] U.S. Cl. ........................ 357/51; 357/14; 357/23.6; 357/41; 307/278; 307/455
[58] Field of Search ............. 357/23.6, 14, 41, 51; 307/455, 475, 362, 278

[56] References Cited

U.S. PATENT DOCUMENTS

| 3,539,880 | 11/1970 | Squire et al. | 357/14 |
| 4,247,826 | 1/1981 | Gappa et al. | 357/23.6 |
| 4,609,837 | 9/1986 | Yagyuu et al. | 307/455 |
| 4,633,291 | 12/1986 | Koyama | 357/51 |
| 4,725,744 | 2/1988 | Yagyuu et al. | 307/455 |
| 4,760,432 | 7/1988 | Stoisiek et al. | 357/23.6 |

FOREIGN PATENT DOCUMENTS

| 60-91721 | 5/1985 | Japan | 307/455 |
| 61-169015 | 7/1986 | Japan | 307/455 |
| 63-166256 | 12/1986 | Japan | 357/14 |
| 62-105528 | 5/1987 | Japan | 307/455 |
| 62-111459 | 5/1987 | Japan | 357/23.6 |
| 0142918 | 2/1989 | Japan | 307/455 |
| 2079535 | 1/1982 | United Kingdom | 357/14 |

Primary Examiner—Andrew J. James
Assistant Examiner—Cynthia S. Deal
Attorney, Agent, or Firm—Antonelli, Terry, Stout & Kraus

[57] ABSTRACT

A MIS capacitor to be implemented in a semiconductor device employing various or predetermined circuits, has a dielectric side electrode which is in contact with a buried layer provided on a semiconductor substrate through a dielectric film and a buried layer-side electrode connected to the buried layer. The buried layer-side electrode of the MIS capacitor is connected to a low-impedance side of the circuit employed therewith. This structure, when connected as such, is capable of reducing the influence of noise attributed to an α-ray and thereby operating the circuit stably. The semiconductor device using a MIS capacitor invention is adaptable to an emitter follower circuit and various logic circuits for preventing malfunction resulting from α-ray radiation.

22 Claims, 5 Drawing Sheets

SEMICONDUCTOR DEVICE USING MIS CAPACITOR

BACKGROUND OF THE INVENTION

The present invention relates to a semiconductor device and, more particularly, to a semiconductor device using a MIS (Metal Insulator Semiconductor) capacitor which prevents malfunction due to α-rays radiated from a slight amount of radioactive material contained in a packaging material or the like.

Figure 9:
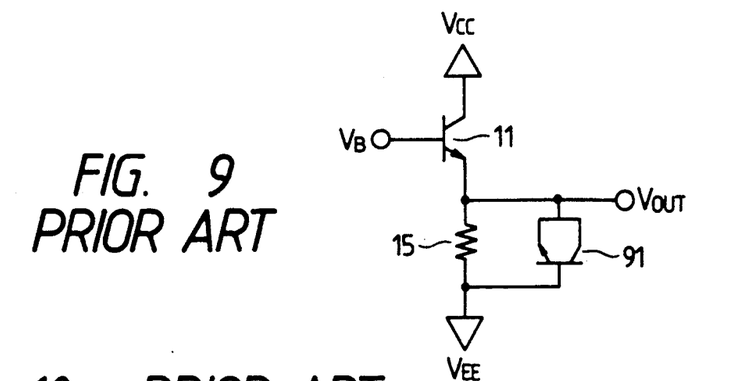
FIG. 9 is a circuit diagram of a conventional emitter follower circuit.
Figure 10A:
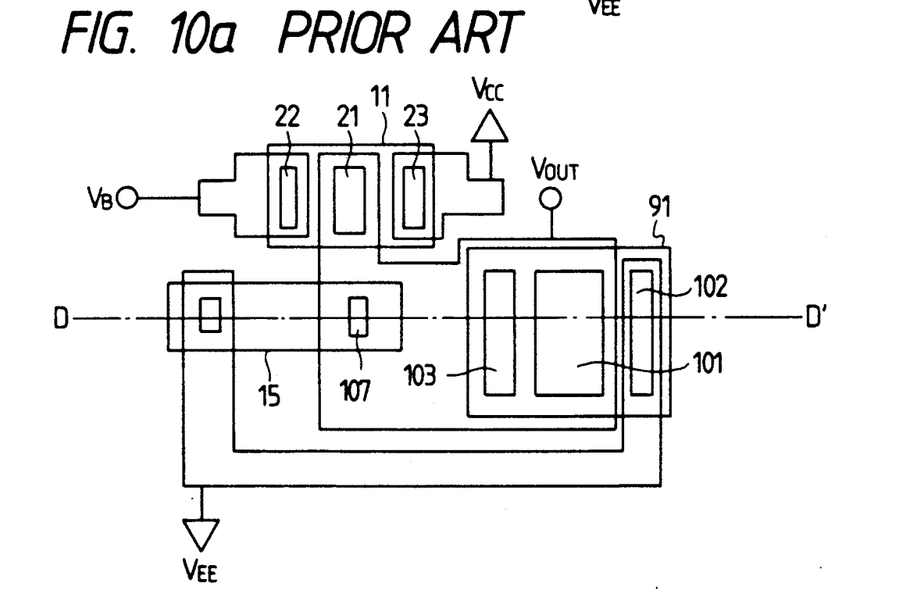
FIG. 10a is a plan view of the conventional emitter follower circuit shown in FIG. 9, explaining the circuit pattern thereof.
Figure 10B:
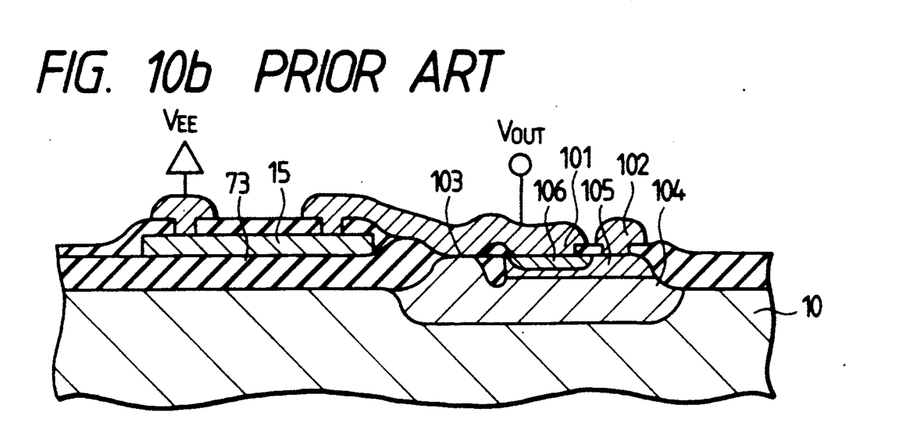
FIG. 10b is a sectional view of the conventional emitter follower circuit shown in FIG. 9, showing the device structure of the circuit pattern thereof.

Many conventional circuits constituted by a transistor have a structure such as that shown in FIG. 9. Such a circuit is called an emitter follower circuit in which an input $V_B$ is connected to the base of a transistor 11 and the emitter constitutes an output $V_{OUT}$ of the circuit. The emitter and the collector of a transistor 91 inserted between the output $V_{OUT}$ and the power source $V_{EE}$ are connected to the output $V_{OUT}$, and the base of the transistor 91 is connected to the power source $V_{EE}$. The transistor 91 having the above-described structure works as a junction capacitance means and has a function of stabilizing the output potential. FIGS. 10a and 10b show an example of circuit patterns for realizing the circuit shown in FIG. 9 in a semiconductor device, wherein FIG. 10a is a plan view and FIG. 10b is a sectional view thereof. In FIG. 10a, a wiring material such as Al is used for the connection between the input $V_B$ and the base electrode 22 of the transistor 11, the connection between the emitter electrode 21 of the transistor 11 and the electrode 107 of a resistor 15, and the emitter electrode 101 and the collector electrode 103 of the transistor 91 which transistor functions as a capacitance means. FIG. 10b is a sectional view of the circuit pattern shown in FIG. 10a, taken along the line D - D', showing the sectional structure and the connected state of the resistor 15 and the transistor 91 provided on a p-substrate 10. In FIGS. 9, 10a and 10b, the symbol Vcc represents a ground potential, the reference numeral 23 a collector electrode, 73 an insulator, 102 a base electrode, 104 an n-type collector layer, 105 a p-type base layer and 106 an n-type emitter layer.

As described above, as a capacitance means for stabilization of a potential, using a junction capacitance means, such as a transistor is typically conventional often used. However, a capacitor means having a structure such as that shown in FIG. 7 has recently come to be used. Such a capacitor means is generally called a MIS capacitor, and is composed of an N+ (or P+) buried layer 72 provided on the p- (or n-) substrate 10, a dielectric-side electrode 13 lead from the buried layer 72 through a dielectric 71, and a buried layer-side electrode 14 connected to the buried layer 72. The electrodes 13 and 14 are symbolically shown in FIG. 7. Since a MIS capacitor has a greater capacitance value per unit area than a junction capacitance means, it is possible to reduce the layout area of the MIS capacitor. Such a MIS capacitor will therefore be frequently used hereafter. A method directed to the fabrication of a MIS capacitor is disclosed in, for example, Japanese Patent Application Laid-Open No. 111459/1987, published on May 22, 1997 (Hitachi Ltds). In this prior art, however, an influence resulting from external noise and, in particular, influence from α-ray radiation is not taken into consideration. In FIG. 9, when an α-ray enters the transistor 91 constituting a junction capacitance means, a noise current due to the α-ray flows from the collector to the substrate of the integrated circuit, as described in Japanese Patent Application Laid-Open No. 169015/1986, published on July 30, 1986, (Hitachi, Ltd.) so that the potential of the output $V_{OUT}$ is temporarily greatly lowered from the set value. Even in the case of using a MIS capacitor such as that shown in FIG. 7 in place of the junction capacitance means, the potential of the output $V_{OUT}$ is subjected to an influence of an α-ray or the like. The reason for this will be described hereinunder.

Figure 7:
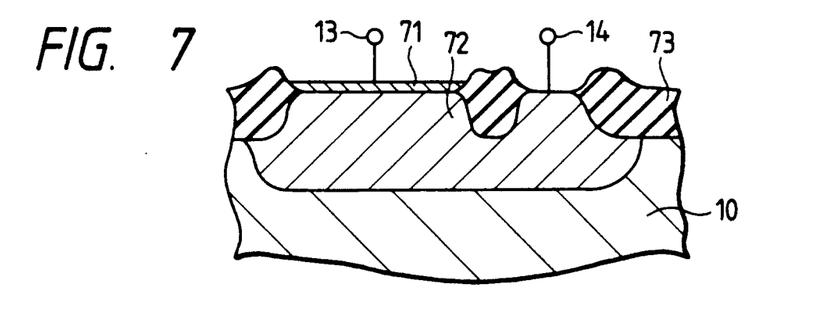
FIG. 7 is a sectional view of a device structure of a MIS capacitor.
Figure 8:
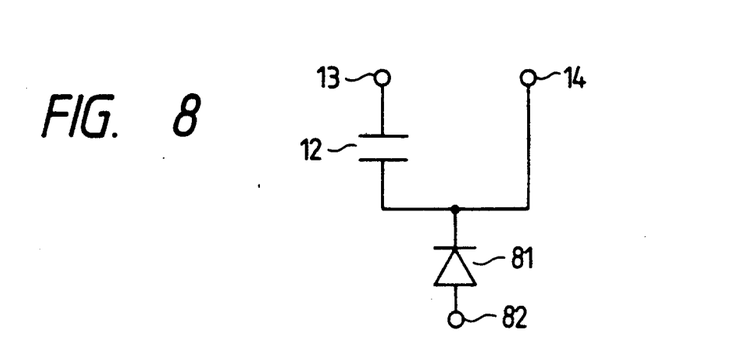
FIG. 8 shows an equivalent circuit of a MIS capacitor.

FIG. 8 shows an equivalent circuit of the MIS capacitor shown in FIG. 7. In FIG. 8, a MIS capacitor 12 is a capacitance means provided between the N+ buried layer 72 and the dielectric-side electrode 13 shown in FIG. 7, and a diode 81 is composed of the N+ buried layer 72 and the p-substrate 10. In the case of using such a capacitance means, since there is no polarity relationship between the dielectric-side electrode 13 and the buried layer-side electrode 14 unlike that of the junction capacitance means, either electrode may be selected with respect to a certain connection node (e.g., the output $V_{OUT}$ in FIG. 9). However, since the capacitance value changes in accordance with the selected electrode and the fact that the capacitance value becomes larger, for example, when the buried layer-side electrode 14 is connected to the output $V_{OUT}$ in FIG. 9, such connection is generally employed. This is because the junction capacitance due to the diode 81 is added. The reference numeral 82 denotes a substrate-side electrode.

When an α-ray enters the MIS capacitor having the above-described connection, the electrons generated within the substrate flow to the N+ buried layer 72, so that the output $V_{OUT}$ is temporarily greatly reduced in the same way as in the case of using the junction capacitance means. As a result, because of the negative pulse noise effected, a malfunction is on a circuit using the output $V_{OUT}$. The negative pulse noise corresponds to a pulse noise potentially directed toward the negative side.

SUMMARY OF THE INVENTION

Accordingly, it is an object of the present invention to eliminate the above-described problems in the prior art and to provide a semiconductor device using a MIS capacitor which is capable of eliminating the adverse influence of an α-ray.

To achieve this aim, in one aspect of the present invention, there is provided a semiconductor device using a MIS capacitor the buried layer-side electrode of which is connected to a low-impedance side or a power supply side of the circuit. Conventionally, the buried layer-side electrode is connected to the side on which the input impedance is higher (ordinarily, several KΩ) in order to increase the capacitance value of the MIS capacitor portion, as described above. Conversely, in the present invention, the buried layer-side electrode is connected to the side on which the input impedance is low or the power supply side on which the input impedance is ordinarily extremely low. The input impedance on the side to which the buried layer-side electrode of the MIS capacitor is connected is lower than the impedance on the side to which the dielectric-side electrode of the MIS capacitor is connected.

When the buried layer-side electrode of the MIS capacitor is connected to the low-impedance side, as described above, it is difficult to add the junction capacitance of a diode which is parasitically formed like in the prior art. Accordingly, the MIS capacitor used in the present invention secures a sufficient capacitance value by itself without using the junction capacitance of the diode by, for example, using a dielectric having a thin thickness as the dielectric constituting the MIS capacitor.

In the present invention, the capacitance value of the MIS capacitor exceeds that of about 100 fF, preferably about 500 fF. This is because the parasitic capacitance at the node of a circuit is ordinarily about several tens to about 500 fF, and a capacitance value larger than such a parasitic capacitance is necessary for the stabilization of the circuit.

The thickness of the dielectric film of the MIS capacitor is preferably less than about 100 Å in order to reduce the circuit area to about the area of a transistor used and enhance the yield while maintaining the above-described capacitance value. With the tendency to the miniaturization of a transistor, it is also necessary to reduce the thickness of the dielectric film. The lower limit of the thickness of a dielectric film is not specified, but it is required to be thick enough so as not to produce a film defect such as a pinhole. Incidentally, the thickness of the dielectric film of a conventional MIS capacitor is several hundred Å.

As the dielectric film of the MIS capacitor, a silicon oxide ($SiO_2$) film, a silicon nitride ($Si_3N_4$) film and the like are usable. It is possible to obtain a higher capacitance value by using a material having a high dielectric constant such as a tantalum oxide ($Ta_2O_5$) film as the dielectric film of the MIS capacitor. Since the dielectric constant of a tantalum oxide film is about 8, which is about twice the dielectric constant of a silicon oxide film, a MIS capacitor using a tantalum oxide film having the same area as a silicon oxide film can produce about twice the capacitance value of a MIS capacitor using the silicon oxide film.

According to the present invention, by connecting the buried layer-side electrode of the MIS capacitor to the side of the capacitor connection on which the input impedance is lower or to the power supply side, it is possible to reduce the potential variation due to a noise current and shorten the potential reset time, thereby preventing malfunction.

The above and other objects, features and advantages of the present invention will become clear from the following description of the preferred embodiments thereof, taken in conjunction with the accompanying drawings.

DESCRIPTION OF THE PREFERRED EMBODIMENTS

Embodiments of the present invention will be explained with reference to the accompanying drawings.

EMBODIMENT 1

Figures 1, 3:
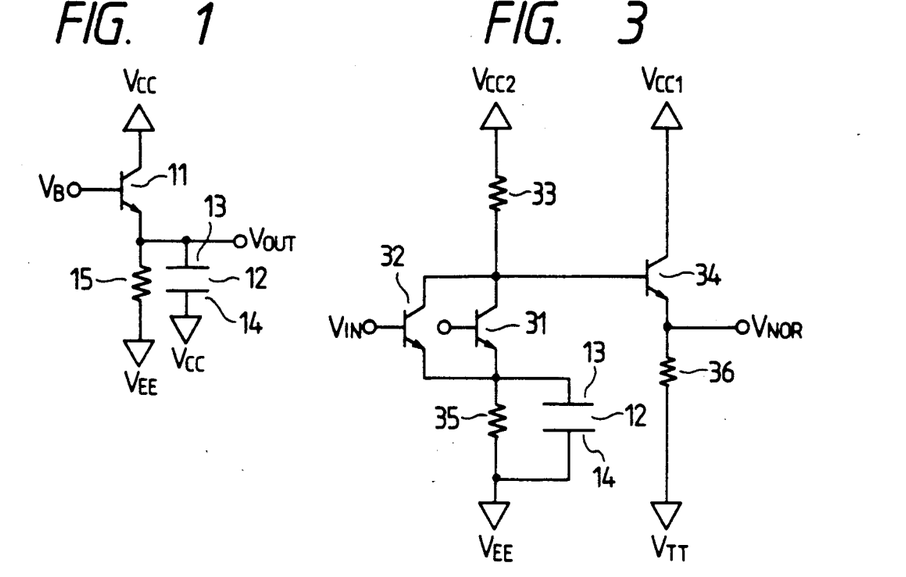
FIGS. 1, 3 and 5 are circuit diagrams of embodiments of the present invention, showing the semiconductor devices using a MIS capacitor.
Figure 2A:
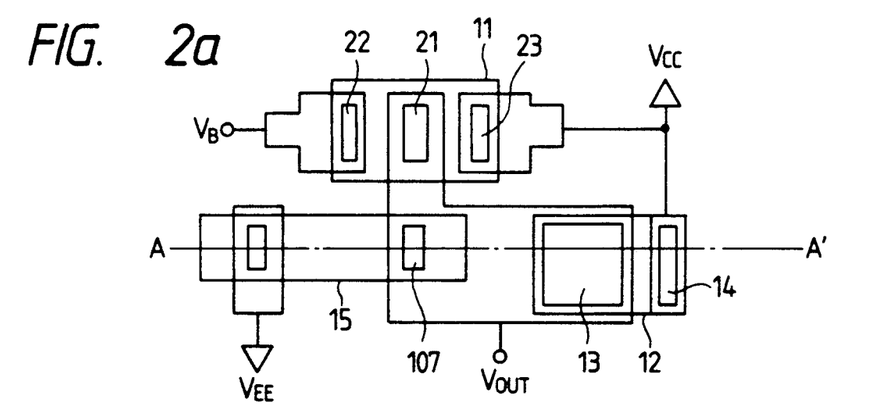
FIGS. 2a, 4a and 6a are plan views of the embodiments shown in FIGS. 1, 3 and 5, respectively, explaining the circuit patterns thereof.
Figure 2B:
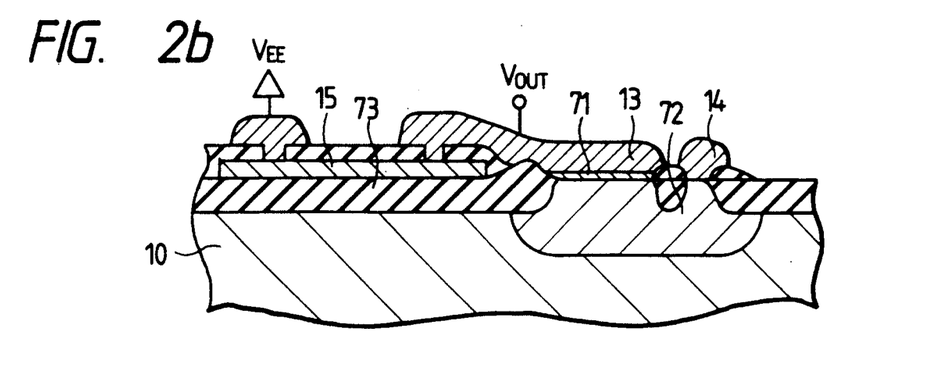
FIGS. 2b, 4b and 6b are sectional views of the embodiments shown in FIGS. 1, 3 and 5, respectively, showing the device structures in the respective circuit patterns.

The present invention is applied to the emitter follower circuit shown in FIG. 9. The circuit diagram thereof is shown in FIG. 1. The input $V_B$ is connected to the base of the transistor 11 and the emitter thereof constitutes the output $V_{OUT}$ of the circuit. In order to stabilize the output potential, a MIS capacitor 12 is inserted between the output $V_{OUT}$ and the ground potential Vcc or the emitter power source. At this time, the electrode 13 of the MIS capacitor 12 is connected to the output $V_{OUT}$, and the buried layer-side electrode 14 is connected to the ground potential Vcc. FIGS. 2a and 2b show an example of the circuit patterns for realizing the circuit shown in FIG. 1 in a semiconductor device, wherein FIG. 2a is a plan view and FIG. 2b is a sectional view thereof. In FIG. 2a, a wiring material such as Al is used for the connection between the input $V_B$ and the base electrode 22 of the transistor 11, and the connection between the emitter electrode 21 of the transistor 11 and the electrode 107 of the resistor 15 and the electrode 13 of the MIS capacitor 12. FIG. 2b is a sectional view of the circuit pattern shown in FIG. 2a, taken along the line A - A', showing the sectional structure and the connected state of the resistor 15 and MIS capacitor 12 provided on the p-substrate 10.

In this embodiment, the MIS capacitor 12 generally has the structure shown in FIG. 7. In this invention, however, since the junction capacitance which is parasitically formed, as described above, is not used, it is necessary to make the capacitance formed by the dielectric 71 as large as possible. For example, by using a silicon oxide film, a silicon nitride film or the like as the dielectric film 71 having a thickness of as small as about 100 Å, it is possible to secure a sufficient capacitance by a small area.

In this embodiment, when the area of the MIS capacitor 12 was about 50 to 500 $\mu m^2$, a capacitance value of 0.1 to 1 pF was obtained.

When an α-ray enters the MIS capacitor 12, the electrons generated as a result of the α-ray radiation become absorbed by the N+ buried layer 72. In this embodiment, since the buried layer-side electrode 14, which is the output electrode of the N+ buried layer 72, is connected to the ground potential Vcc, all the absorbed electrons flow to the ground side. The output $V_{OUT}$ connected to the electrode 13 is therefore not adversely influenced by the penetration of α-ray.

In the prior art, negative pulse noise having a sharp peak of several 100 mV is generated on the output $V_{OUT}$ when α-ray radiation enters or penetrates the MIS capacitor. In contrast, in this embodiment, such a negative pulse noise would not result as was determined by the present inventors, even when an α-ray enters the M/S capacitor.

As described above, according to this embodiment, it is possible to protect the output $V_{OUT}$ from the influence of an α-ray which may enter the MIS capacitor, thereby maintaining a stable potential thereat.

EMBODIMENT 2

FIG. 3 shows a circuit diagram of the present invention applied to a non-threshold logic (hereinunder referred to as "NTL") circuit. In the NTL circuit, a capacitor means is provided for the purpose of speed-up in parallel to a resistor 35 which is provided between the emitters of input transistors 31, 32 and the power source $V_{EE}$. If the MIS capacitor is used as the capacitance means, the buried layer-side electrode 14 is connected to the power source $V_{EE}$ as in this embodiment. As in Embodiment 1, it is possible to keep the output $V_{NOR}$ stable without being influenced by an α-ray which may enter the MIS capacitor 12. In FIG. 3, the reference numerals 33 and 36 represent resistors, 34 an emitter follower transistor, and the symbols Vcc1 and Vcc2 represent ground potentials, $V_{IN}$ an input signal, and $V_{TT}$ a power source.

In this embodiment, the emitters of a plurality of base-input type transistors are connected to each other, and the collectors thereof are also connected to each other. The emitters are connected to the emitter power source through the resistor and the capacitance means is provided between the emitters and the emitter power source or the ground potential. The collectors are grounded through another resistor and the collector side constitutes the output of the thus-formed non-threshold logic circuit. The MIS capacitor is used as the capacitance means in the non-threshold logic circuit. The buried layer-side electrode of the MIS capacitor is connected to the emitter power source or grounded, and the dielectric-side electrode is connected to the emitters.

Figure 4A:
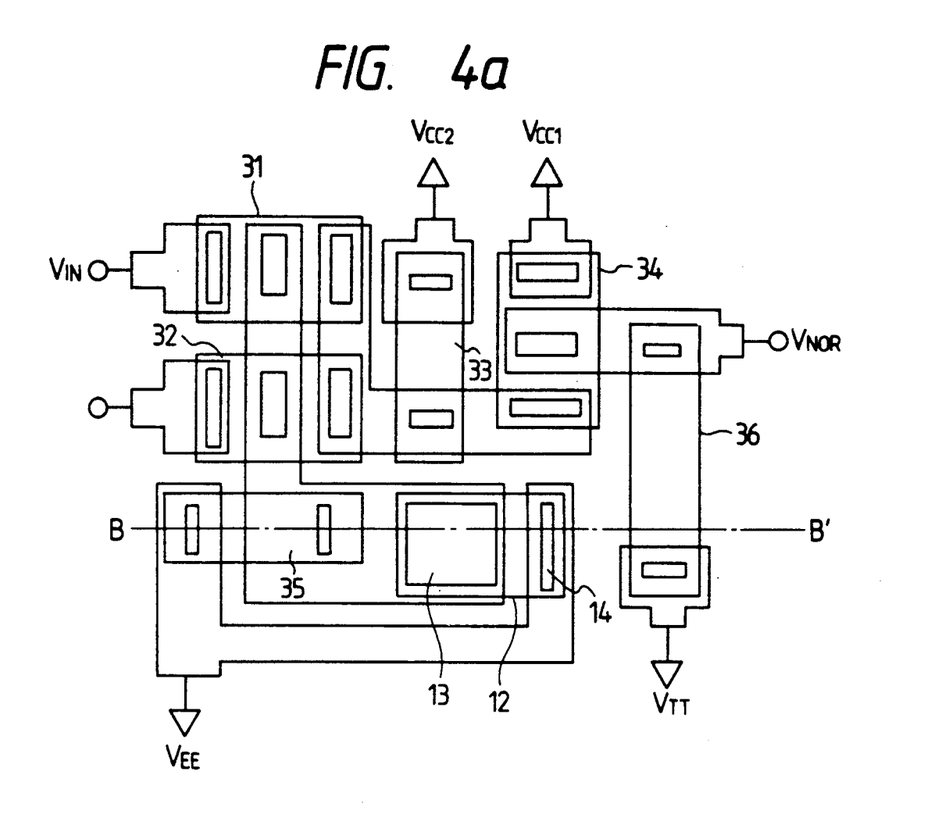
Figure 4B:
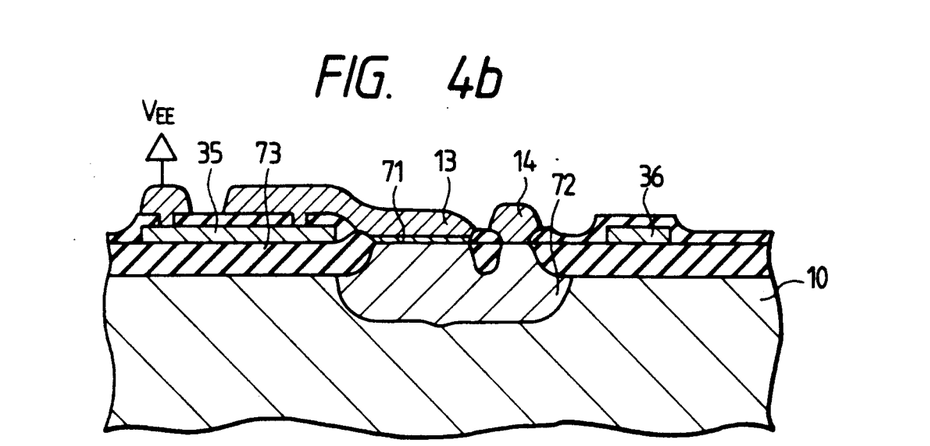

FIGS. 4a and 4b show an example of the circuit patterns for realizing the circuit shown in FIG. 3 in a semiconductor device, wherein FIG. 4a is a plan view and FIG. 4b is a sectional view thereof. In FIG. 4a, a wiring material such as Al is used for the connection between the input signal $V_{IN}$ and the base electrode of the input transistor 31, and the connection between the emitters of the input transistors 31, 32 and the electrode 13 of the MIS capacitor 12. FIG. 4b is a sectional view of the circuit pattern shown in FIG. 4a, taken along the line B—B', showing the sectional structure and the connected state of the resistors 35, 36 provided on the p-substrate 10 and the MIS capacitor 12.

The area and the capacitance value of the MIS capacitor 12 in this embodiment are fundamentally the same as in Embodiment 1, but the area of the MIS capacitor may be enlarged so as to slightly increase the capacitance value in accordance with the load capacitance applied to the output $V_{NOR}$.

In the prior art, negative pulse noise having a sharp peak of several 100 mV is generated on the base of the emitter follower transistor 34 or the output $V_{NOR}$ due to the influence of the α-ray which has entered the MIS capacitor. In contrast, in this embodiment, such negative pulse noise would not result as was determined by the present inventors, even when an α-ray enters, i.e. under the condition of α-ray radiation;

EMBODIMENT 3

Figure 5:
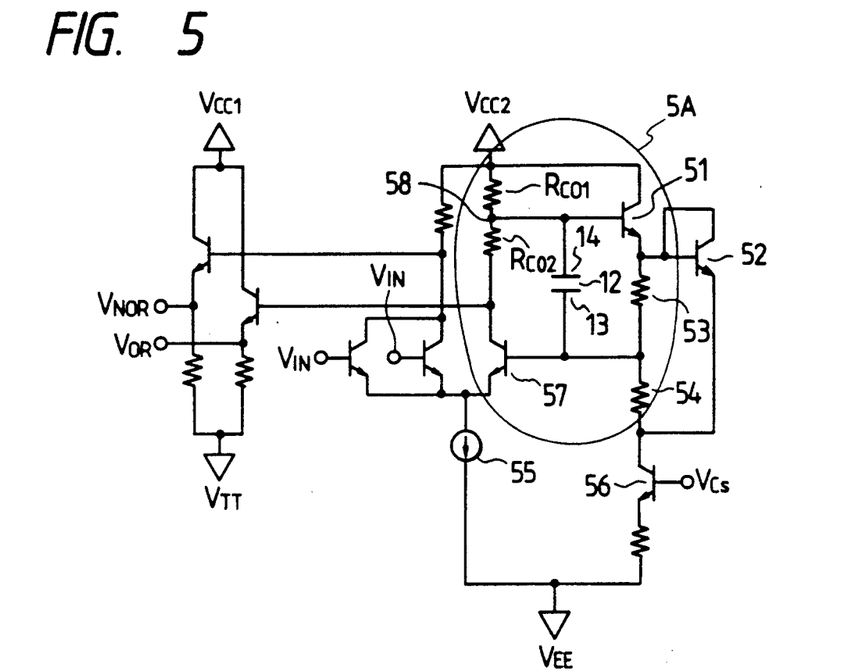

FIG. 5 is a circuit diagram of still another embodiment of the present invention. In this embodiment, the present invention is applied to a logic circuit which is described in U.S. Pat. No. 4,609,837, Japanese Patent Application Laid-Open No. 91721/1985 and Japanese Patent Application Laid-Open No. 316517/1988. In FIG. 5, the symbols $V_{OR}$ and $V_{NOR}$ represent the outputs of the OR circuit and the NOR circuit, respectively. The MIS capacitor 12 serves to reduce the impedance of the feedback loop. The buried layer-side electrode 14 is connected to the connection 58 of divided resistors $R_{CO1}$ and $R_{CO2}$. According to this structure, the electrons produced when an α-ray enters the MIS capacitor 12 are discharged through the divided resistor $R_{CO1}$, so that the potential variation produced then is limited to a small value. In this way, according to this embodiment, it is also possible to operate the circuit stably without much adverse influence by an α-ray.

In FIG. 5, the reference numerals 51, 56 an 57 represent transistors, 52 a diode constituted by employing a transistor, 53 54 resistors, and 55 represents a constant current source, and the symbol $V_{CS}$ represents a bias voltage for the transistor 56.

In other words, this embodiment is a high-speed logic circuit comprising: a logic part comprised of a differential transistor circuit for comparing an input signal with a reference voltage; a feedback circuit for receiving an in-phase output from the differential transistor circuit the output of which is logically in-phase to the input signal, and supplying an output signal to the differential transistor circuit as the reference voltage, the feedback circuit including a first transistor having a base applied with the in-phase output of the differential transistor circuit, and a first resistor coupled at one end thereof to an emitter of the first transistor, wherein the output signal of the feedback circuit serving as the reference voltage is generated at the other end of the first resistor; a constant current source circuit connected between the other end of the first resistor and a power source for supplying a predetermined first voltage; and electrostatic capacitance means coupled between the base of the first transistor and a point at which the differential transistor circuit receives the output signal of the feedback circuit; wherein the MIS capacitor is used as the electrostatic capacitance means and the buried layer-side electrode thereof is connected to the base of the first transistor. The base of the first transistor is connected to the connection 58 of the divided resistors $R_{CO1}$ and $R_{CO2}$. The logical operation of the high-speed logic circuit is described in detail in, e.g., U.S. Pat. No. 4,609,837, issued on Sept. 2, 1986 to M. Yagyuu, et al. and assigned to Hitachi, Ltd., Japanese Patent Application Laid-Open No. 91721/1985 published on May 23, 1985 (Hitachi Ltd.), and Japanese Patent Application Laid-Open No. 316517/1988 published on Dec. 23, 1988 (Hitachi, Ltd.)

Figure 6A:
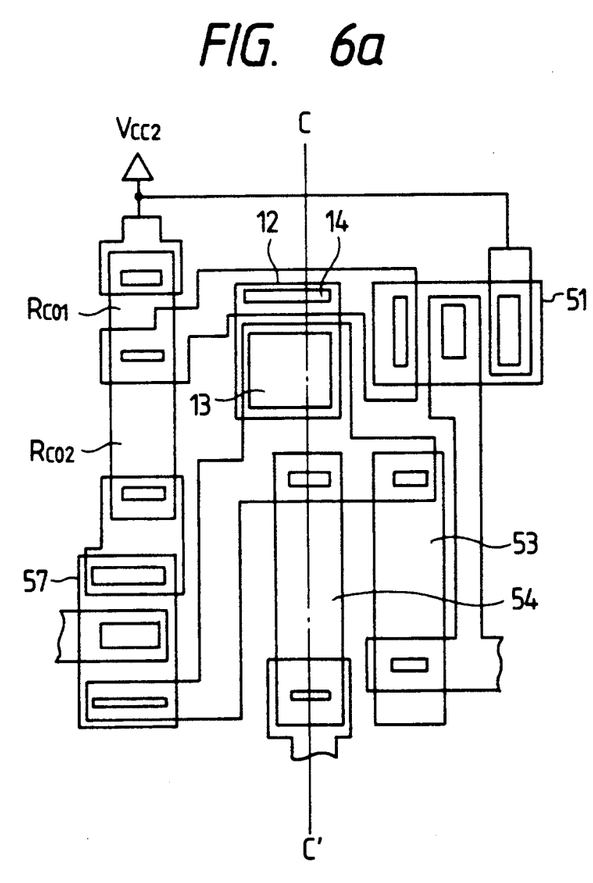
Figure 6B:
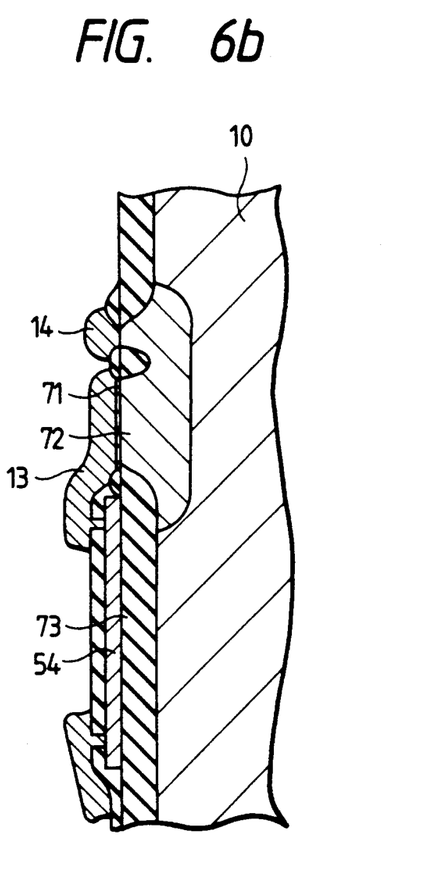

FIGS. 6a and 6b show the circuit patterns of the feedback loop portion 5A of the circuit shown in FIG. 5, wherein FIG. 6a is a plan view and FIG. 6b is a sectional view thereof. In FIG. 6a, the buried layer-side electrode 14 of the MIS capacitor 12 is connected to the connection 58 of the divided resistors $R_{CO1}$ and $R_{CO2}$, and the electrode 13 is connected to the base of the transistor 57. FIG. 6b is a sectional view of the circuit pattern shown in FIG. 6a, taken along the line C - C', showing the sectional structure and the connected state of the resistor 54 provided on the p-substrate 10 and the MIS capacitor 12.

In this embodiment, the area of the MIS capacitor 12 is about 200 $\mu m^2$ and the capacitance value thereof is about 0.5 pF.

In the prior art, pulse noise of several 100 mV is generated on the outputs $V_{NOR}$ and $V_{OR}$ because the base potential of the transistor 57 varies due to the influence of the α-ray which has entered the MIS capacitor. In contrast, in this embodiment, such pulse noise was hardly observed, even when an α-ray had entered.

Although semiconductor devices using a MIS capacitor provided on a p-substrate have been explained in the above embodiments, the present invention was also able to be applied to the MIS capacitor provided by forming a P+ buried layer on an n- substrate.

In the above-described drawings, the same numerals denote the same portions.

As described above, according to the present invention, since it is possible to reduce the influence of an α-ray which enters a MIS capacitor, it is possible to operate the circuit stably.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor device including a predetermined circuit using a MIS capacitor which comprises:
   a buried layer provided on a semiconductor substrate of a first conductivity type, said buried layer being of a second conductivity type which is opposite to said first conductivity type.
   a first electrode, corresponding to a buried layer-side electrode of said MIS capacitor, being connected to said buried layer; and
   a second electrode, corresponding to a dielectric side electrode of said MIS capacitor, being in contact with said buried layer through a dielectric film provided on said buried layer,
   wherein said MIS capacitor is connected to said predetermined circuit such that the first electrode of said MIS capacitor is electrically connected at a location in said predetermined circuit having a relatively lower impedance than at a location thereof whereat the second electrode of said MIS capacitor is connected.
   wherein said dielectric film has a thickness which is not more than 100 Å, and
   wherein said dielectric film is one selected from the group consisting of a silicon oxide film, a silicon nitride film and a tantalum oxide film.

2. A semiconductor device including a predetermined circuit using a MIS capacitor which comprises:
   a buried layer provided on a semiconductor substrate of a first conductivity type, said buried layer being of a second conductivity type.
   a first electrode, corresponding to a buried layer-side electrode of said MIS capacitor, being connected to said buried layer; and
   a second electrode, corresponding to a dielectric side electrode of said MIS capacitor, being in contact with said buried layer through a dielectric film provided on said buried layer,
   wherein said dielectric film has a thickness which is not more than 100 Å, and
   wherein said dielectric film is one selected from the group consisting of a silicon oxide film, a silicon nitride film and a tantalum oxide film, and
   wherein the second and first electrodes of said MIS capacitor are electrically connected to a potential node and a power source, respectively, of said predetermined circuit, said power source corresponding to a relatively lower impedance connection side of the MIS capacitor electrodes than the potential node connection side thereof.

3. A semiconductor device including an emitter follower circuit using a MIS capacitor which comprised:
   a buried layer provided on a semiconductor substrate of a first conductivity type, said buried layer being of a second conductivity type which is opposite to said first conductivity type.
   a first electrode, corresponding to a buried layer-side electrode of said MIS capacitor, being connected to said buried layer; and
   a second electrode, corresponding to a dielectric side electrode of said MIS capacitor, being in contact with said buried layer through a dielectric film provided on said buried layer,
   wherein said dielectric film has a thickness which is not more than 100 Å,
   wherein said dielectric film is one selected from the group consisting of a silicon oxide film, a silicon nitride film and a tantalum oxide film, and
   wherein the second and first electrodes of said MIS capacitor are electrically connected to the emitter of a transistor constituting said emitter follower circuit and one of a ground potential and an emitter power source, respectively, said first electrode which is electrically connected to said one of a ground potential and an emitter power source corresponds to a connection having a relatively lower impedance than the emitter connection side of said MIS capacitor.

4. A semiconductor device including a predetermined circuit using a MIS capacitor which comprises:
   a buried layer provided on a semiconductor substrate of a first conductivity type, said buried layer being of a second conductivity type which is opposite to said first conductivity type.
   a first electrode, corresponding to a buried layer-side electrode of said MIS capacitor, being connected to said buried layer; and
   a second electrode, corresponding to a dielectric side electrode of said MIS capacitor, being in contact with said buried layer through a dielectric film provided on said buried layer.
   wherein said dielectric film has a thickness which is not more than 100 Å, and
   wherein said dielectric film is one selected from the group consisting of a silicon oxide film, a silicon nitride film and a tantalum oxide film, and
   wherein said predetermined circuit is a non-threshold logic circuit which includes a plurality of base-input type transistors in which the emitters thereof are connected to each other, the collectors thereof are connected to each other, said emitters are connected to an emitter power source through a resistor, said collectors are grounded through another resistor, and the collector side of said non-threshold logic circuit is used for providing an output thereof, and
   wherein said MIS capacitor is disposed such that the second and first electrodes thereof are electrically connected to the commonly connected emitters and one of said emitter power source and ground potential, respectively, said first electrode which is electrically connected to said one of said emitter power source and ground potential corresponds to a connection having a relative lower impedance than the emitter connection side of said MIS capacitor.

5. A semiconductor device of a high-speed logic circuit using a MIS capacitor, said circuit comprising:
a logic part comprised of a differential transistor circuit for comparing an input signal with a reference voltage;
a feedback circuit having an input for receiving an output signal, from an output of said differential transistor circuit, which is logically in-phase to said input signal, and having an output for providing an output signal thereof to said differential transistor circuit as said reference voltage, said feedback circuit including ga first transistor having a base coupled to the output of said differential transistor circuit, and a first resistor coupled at one end thereof to an emitter of said first transistor, wherein the output signal of said feedback circuit, serving as said reference voltage, is generated at another end of said first resistor and is applied at a reference input of said differential transistor circuit;
a constant current source circuit connected between said another end of said first resistor and a power source for supplying a predetermined voltage; and
electrostatic capacitance means coupled between the base of said first transistor and the reference input of said differential transistor circuit,
wherein said electrostatic capacitance means includes a MIS capacitor which comprises:
a buried layer provided on a semiconductor substrate of a first conductivity type, said buried layer being of a second conductivity type which is opposite to said first conductivity type,
a first electrode, corresponding to a buried layer-side electrode of said MIS capacitor, being connected to said buried layer, and
a second electrode, corresponding to a dielectric-side electrode of said MIS capacitor, being in contact with said buried layer through a dielectric film provided on said buried layer,
wherein said MIS capacitor is disposed such that the first electrode thereof is electrically connected to the base of said first transistor and the second electrode thereof is electrically connected to the reference input of said differential transistor circuit, the first electrode connection corresponding to a relatively lower impedance connection side of said MIS capacitor than that with respect to the second electrode connection.

6. A semiconductor device of a high-speed logic circuit according to claim 5, wherein said dielectric film has a thickness which is not more than about 100 Å.

7. A semiconductor device of a high-speed logic circuit according to claim 6, wherein said dielectric film is one selected from a group consisting of a silicon oxide film, a silicon nitride film, and a tantalum oxide film.

8. A semiconductor device of a high-speed logic circuit according to claim 5, wherein said dielectric film is one selected from a group consisting of a silicon oxide film, a silicon nitride film, and a tantalum oxide film.

9. A semiconductor device of a high-speed logic circuit according to claim 5 wherein said differential transistor circuit further includes a resistor divider coupled between a reference supply potential and a collector of one transistor of a pair of differentially-coupled transistors, corresponding to said differential transistor circuit, and which transistor corresponds to a non-inverting differential side thereof, and wherein said resistor divider is electrically connected to the first electrode of said MIS capacitor and base of the transistor of said feedback circuit.

10. A semiconductor device of a high-speed logic circuit according to claim 9, wherein said dielectric film is one selected from a group consisting of a silicon oxide film, a silicon nitride film, and a tantalum oxide film.

11. A semiconductor device according to claim 1, wherein said dielectric film is a silicon oxide film.

12. A semiconductor device according to claim 1, wherein said dielectric film is a silicon nitride film 13. A semiconductor device according to claim 1, wherein said dielectric film is a tantalum oxide film.

14. A semiconductor device according to claim 2, wherein said dielectric film is a silicon oxide film.

15. A semiconductor device according to claim 2, wherein said dielectric film is a silicon nitride film.

16. A semiconductor device according to claim 2, wherein said dielectric film is a tantalum oxide film.

17. A semiconductor device according to claim 3, wherein said dielectric film is a silicon oxide film.

18. A semiconductor device according to claim 3, wherein said dielectric film is a silicon nitride film.

19. A semiconductor device according to claim 3, wherein said dielectric film is a tantalum oxide film.

20. A semiconductor device according to claim 4, wherein said dielectric film is a silicon oxide film.

21. A semiconductor device according to claim 4, wherein said dielectric film is a silicon nitride film.

22. A semiconductor according to claim 4, wherein said dielectric film is a tantalum oxide film.

* * * * *